US012051678B2

United States Patent
Daudin et al.

(10) Patent No.: US 12,051,678 B2
(45) Date of Patent: Jul. 30, 2024

(54) METHOD FOR MANUFACTURING AN OPTOELECTRONIC DEVICE WITH AXIAL-TYPE ELECTROLUMINESCENT DIODES

(71) Applicants: Commissariat à l'Énergie Atomique et aux Énergies Alternatives, Paris (FR); Aledia, Echirolles (FR); Universite Grenoble Alpes, Saint Martin D'Heres (FR)

(72) Inventors: Bruno-Jules Daudin, Grenoble (FR); Walf Chikhaoui, Voiron (FR); Marion Gruart, Saint-Egreve (FR)

(73) Assignees: Commissariat à l'Énergie Atomique et aux Énergies Alternatives, Paris (FR); Aledia, Echirolles (FR); Universite Grenoble Alpes, Saint Martin D'Heres (FR)

( * ) Notice: Subject to any disclaimer, the term of this patent is extended or adjusted under 35 U.S.C. 154(b) by 401 days.

(21) Appl. No.: 17/619,564

(22) PCT Filed: Jun. 25, 2020

(86) PCT No.: PCT/EP2020/067967
§ 371 (c)(1),
(2) Date: Dec. 15, 2021

(87) PCT Pub. No.: WO2020/260546
PCT Pub. Date: Dec. 30, 2020

(65) Prior Publication Data
US 2022/0376131 A1    Nov. 24, 2022

(30) Foreign Application Priority Data
Jun. 25, 2019 (FR) .................................... 1906899

(51) Int. Cl.
*H01L 25/075*   (2006.01)
*H01L 33/00*    (2010.01)
(Continued)

(52) U.S. Cl.
CPC ...... *H01L 25/0753* (2013.01); *H01L 33/0062* (2013.01); *H01L 33/007* (2013.01);
(Continued)

(58) Field of Classification Search
CPC .................................................. H01L 25/0753
See application file for complete search history.

(56) References Cited

U.S. PATENT DOCUMENTS 9,559,256 B2 * 1/2017 Amstatt ............ H01L 21/02381
9,793,431 B2 * 10/2017 Hyot ....................... H01L 33/12
(Continued)

FOREIGN PATENT DOCUMENTS

EP     2 290 710 A1    3/2011
WO    WO 2019/002786 A1    1/2019

OTHER PUBLICATIONS

International Search Report and Written Opinion for International Application No. PCT/EP2020/067967, mailed Sep. 14, 2020.
(Continued)

Primary Examiner — William A Harriston
(74) Attorney, Agent, or Firm — Wolf, Greenfield & Sacks, P.C.

(57) ABSTRACT

A light-emitting diode manufacturing method including the forming of three-dimensional semiconductor elements, extending along parallel axes, made of a III-V compound, each having a lower portion and a flared upper portion inscribed within a frustum of half apical angle α. The method further comprises, for each semiconductor element, the forming of an active area covering the top of the upper portion and the forming of at least one semiconductor layer (Continued)

of the III-V compound covering the active area by vapor deposition at a pressure lower than 10 mPa, by using a flux of the group-III element along a direction inclined by an angle θIII and a flux of the group-V element along a direction inclined by an angle θV with respect to the vertical axis, angles θIII and θV being smaller than angle α.

12 Claims, 4 Drawing Sheets

(51) Int. Cl.
      *H01L 33/06*     (2010.01)
      *H01L 33/14*     (2010.01)
      *H01L 33/20*     (2010.01)
      *H01L 33/30*     (2010.01)
      *H01L 33/32*     (2010.01)

(52) U.S. Cl.
    CPC .......... *H01L 33/0075* (2013.01); *H01L 33/06* (2013.01); *H01L 33/145* (2013.01); *H01L 33/20* (2013.01); *H01L 33/30* (2013.01); *H01L 33/32* (2013.01)

(56) References Cited

U.S. PATENT DOCUMENTS

2007/0248132 A1   10/2007  Kikuchi et al.
2010/0060130 A1*  3/2010  Li ........................ F21V 29/773
                                                                 313/46
2016/0141451 A1*  5/2016  Amstatt ............ H01L 21/02639
                                                                 438/47
2018/0351037 A1*  12/2018  Zhang ............... H01L 21/02387

OTHER PUBLICATIONS

[No Author Listed] GENxplor R&D MBE System: Industry's First Fully-Integrated MBE System for the Compound Semiconductor R&D Market. Veeco. Aug. 2014:1-2.

Fernández-Garrido et al., Self-regulated radius of spontaneously formed GaN nanowires in molecular beam epitaxy. Nano letters. Jul. 10, 2013;13(7):3274-80.

Foxon et al., A complementary geometric model for the growth of GaN nanocolumns prepared by plasma-assisted molecular beam epitaxy. Journal of Crystal Growth. Jun. 15, 2009;311(13):3423-7.

Kikuchi et al., InGaN/GaN multiple quantum disk nanocolumn light-emitting diodes grown on (111) Si substrate. Japanese Journal of Applied Physics. Nov. 5, 2004;43(12A):L1524.

Kishino et al., Green-light nanocolumn light emitting diodes with triangular-lattice uniform arrays of InGaN-based nanocolumns. IEEE Journal of Quantum Electronics. May 19, 2014;50(7):538-47.

Kishino et al., Monolithic integration of InGaN-based nanocolumn light-emitting diodes with different emission colors. Applied Physics Express. Dec. 21, 2012;6(1):012101.

Ra et al., Full-color single nanowire pixels for projection displays. Nano Letters. Jul. 13, 2016;16(7):4608-15.

Zhang et al., Growth mechanism of InGaN nano-umbrellas. Nanotechnology. Oct. 11, 2016;27(45):455603.

International Preliminary Report on Patentability for International Application No. PCT/EP2020/067967, mailed Jan. 6, 2022.

* cited by examiner

METHOD FOR MANUFACTURING AN OPTOELECTRONIC DEVICE WITH AXIAL-TYPE ELECTROLUMINESCENT DIODES

This application is a national stage filing under 35 U.S.C. § 371 of International Patent Application Serial No. PCT/EP2020/067967, filed Jun. 25, 2020, which claims priority to French patent application FR19/06899, filed Jun. 25, 2019. The contents of these applications are incorporated herein by reference in their entirety.

TECHNICAL BACKGROUND

The present invention generally concerns optoelectronic devices with light-emitting diodes comprising three-dimensional semiconductor elements, for example, microwires, nanowires, micrometer- or nanometer-range conical elements, or micrometer- or nanometer-range frustoconical elements, and methods of manufacturing such devices.

PRIOR ART

The improvement of axial-type light-emitting diodes, comprising an active area formed at the top of each three-dimensional element, is here more particularly considered. Call active area of the light-emitting diode the region from which most of the electromagnetic radiation delivered by the light-emitting diode is emitted.

The three-dimensional elements considered herein comprise a semiconductor material mainly comprising a group-III element and a group-V element (for example, gallium nitride GaN), called III-V compound hereafter. Such devices are for example described in U.S. Pat. No. 9,728,680.

Each active area is sandwiched between the associated three-dimensional semiconductor element, which is generally doped with a first conductivity type, and a semiconductor layer of the same III-V compound as the semiconductor element and doped with the opposite conductivity type.

An example of a method of manufacturing the optoelectronic device comprises forming the semiconductor elements, the active areas, and the semiconductor layers by varying the growth parameters to favor an axial crystalline growth. It may however not be possible to totally prevent the forming of the semiconductor layer on the lateral walls of the active area and of the associated three-dimensional semiconductor element. This may cause the forming of passages for the current shorting the active area, causing a decrease in the emission performance of the optoelectronic device.

SUMMARY

Thus, an object of an embodiment is to at least partly overcome the disadvantages of the previously-described optoelectronic devices and of their manufacturing methods.

Another object of an embodiment is to improve the emission performance of the optoelectronic device with axial-type light-emitting diodes.

Thus, an embodiment provides a method of manufacturing an optoelectronic device comprising light-emitting diodes comprising the forming of three-dimensional semiconductor elements, extending along parallel axes, made of a III-V compound, and each comprising a lower portion and an upper portion flared with respect to the lower portion and inscribed within a frustum having a half apical angle α. The method further comprises, for each semiconductor element, the forming of an active area covering the top of the upper portion and the forming of at least one semiconductor layer of the III-V compound covering the active area by vapor deposition at a pressure lower than 10 mPa, by using a flux of the group-III element along a first direction inclined by an angle $\theta_{III}$ and a flux of the group-V element along a second direction inclined by an angle $\theta_V$ with respect to the vertical axis, the largest of the two angles $\theta_{III}$ and $\theta_V$ being smaller than angle α.

According to an embodiment, the semiconductor layers are formed by molecular beam epitaxy.

According to an embodiment, the III/V ratio, for the forming of the semiconductor layers, is smaller than 1.4, preferably smaller than 1.3.

According to an embodiment, angle α is greater than 0°, preferably in the range from 5° to 50°, more preferably in the range from 5° to 30°.

According to an embodiment, the upper portions of the three-dimensional semiconductor elements are formed by molecular beam epitaxy.

According to an embodiment, the III/V ratio, for the forming of the upper portions of the three-dimensional semiconductor elements, is greater than 1.1.

According to an embodiment, the lower portions of the three-dimensional semiconductor elements are formed by molecular beam epitaxy.

According to an embodiment, the III/V ratio, for the forming of the lower portions of the three-dimensional semiconductor elements, is smaller than 1.4.

According to an embodiment, the temperature during the forming of the upper portions of the three-dimensional semiconductor elements is smaller by at last 50° C. than the temperature during the forming of the lower portions of the three-dimensional semiconductor elements.

According to an embodiment, the active areas are formed by molecular beam epitaxy.

According to an embodiment, the lower portions of the three-dimensional semiconductor elements are microwires, nanowires, micrometer- or nanometer-range conical elements, or micrometer- or nanometer-range frustoconical elements.

According to an embodiment, the active areas are the regions having most of the electromagnetic radiation supplied by the light-emitting diodes emitted therefrom.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail. In particular, the optoelectronic device biasing and control means are well known and will not be described.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to an optoelectronic device in a normal position of use.

Unless specified otherwise, the expressions "around", "approximately", "substantially" and "in the order of" signify within 10%, and preferably within 5%. Unless specified otherwise, the expressions "around", "approximately", "substantially" and "in the order of" signify within 10%, and preferably within 5%.

The present description concerns optoelectronic devices comprising three-dimensional semiconductor elements, for example, microwires, nanowires, micrometer- or nanometer-range conical elements, or micrometer- or nanometer-range frustoconical elements. In particular, a conical or frustoconical element may be a circular conical or circular frustoconical element or a pyramidal conical or pyramidal frustoconical element. In the following description, embodiments are described for optoelectronic devices comprising microwires or nanowires. However, such embodiments may be implemented for semiconductor elements other than microwires or nanowires, for example, conical or frustoconical elements.

The term "microwire", "nanowire", "conical element", or "frustoconical element" designates a three-dimensional structure having a shape, for example, cylindrical, conical, or frustoconical, elongated along a main direction, called axis hereafter, having at least two dimensions, called minor dimensions, in the range from 5 nm to 2.5 µm, preferably from 50 nm to 1 µm, the third dimension, called major dimension, being greater than or equal to 1 time, preferably greater than or equal to 5 times, and more preferably still greater than or equal to 10 times, the largest minor dimension, for example, in the range from 1 µm to 50 µm.

Figure 1:
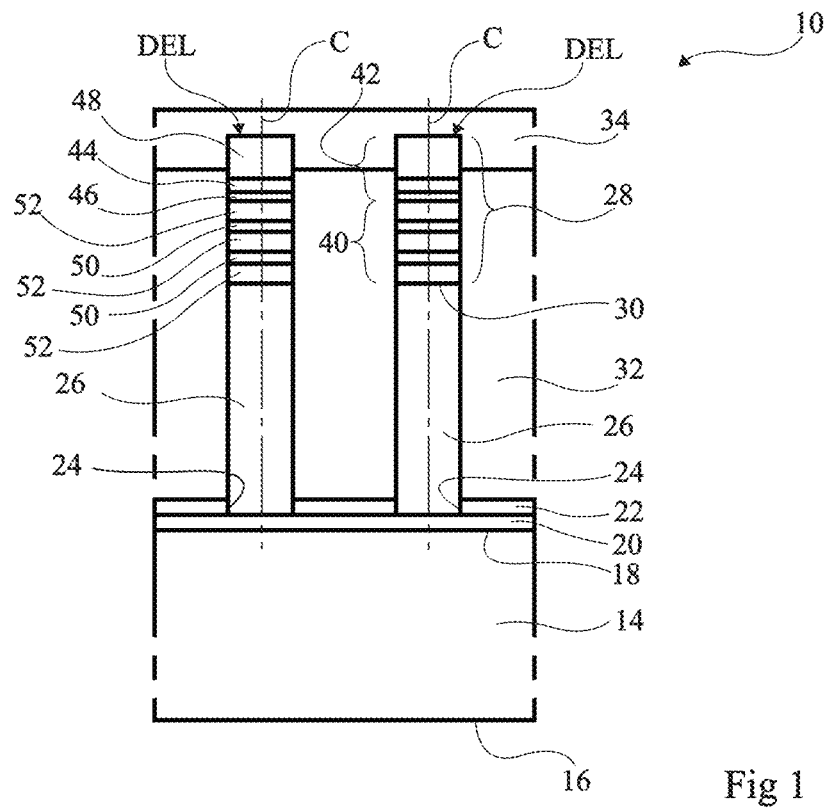
FIG. 1 is a partial simplified cross-section view of an example of an optoelectronic device comprising axial-type light-emitting diodes obtained according to ideal manufacturing conditions.

FIG. 1 is a partial simplified cross-section view of an example of an optoelectronic device 10 with axial-type light-emitting diodes. Optoelectronic device 10 comprises, from bottom to top in FIG. 1:

a substrate 14, for example, a semiconductor substrate, comprising parallel surfaces 16 and 18, preferably planar, surface 18 being treated to promote the growth of wires. This treatment is schematically shown in FIG. 1 by a seed layer 20 made of a material favoring the growth of wires, on surface 18 of substrate 14;

an insulating layer 22 covering seed layer 20 and comprising through openings 24;

wires 26 having parallel axes C, two wires 26 being shown in FIG. 1 at least partly doped with a first conductivity type, for example, n-type doped;

for each wire 26, a head 28 covering the top 30 of wire 26;

an insulating layer 32 covering the lateral surfaces of wires 26 and partially the lateral surfaces of heads 28; and an electrode layer 34 covering insulating layer 32 and in contact with heads 28.

Optoelectronic device 10 comprises another electrode, not shown, to bias the base of wires 26.

Each head 28 comprises, from bottom to top in FIG. 1:

an active area 40 covering the top 30 of wire 26; and a semiconductor stack 42 covering active area 40 and comprising a doped semiconductor layer 44 of a second conductivity type opposite to that of wire 26, for example, p-type doped, and covering active area 40.

The assembly formed by each wire 26 and the associated head 28 forms a light-emitting diode DEL in axial configuration.

Semiconductor stack 42 may further comprise an electron-blocking layer 46 between active area 40 and semiconductor layer 44 and a semiconductor bonding layer 48 covering semiconductor layer 44 on the side opposite to active area 40, bonding layer 48 being covered with electrode layer 34. The electron-blocking layer 46 in contact with active layer 40 and semiconductor layer 44 enables to optimize the presence of electric carriers in active area 40. Bonding layer 48 may be made of the same material as semiconductor layer 44 and doped with the same conductivity type as semiconductor layer 44 but with a higher dopant concentration to enable the forming of an ohmic contact between semiconductor layer 44 and electrode layer 34.

Active area 40 is the area of light-emitting diode DEL having most of the electromagnetic radiation delivered by light-emitting diode DEL emitted therefrom. According to an example, active area 40 may comprise confinement means. Active area 40 may comprise at least one quantum well, comprising a layer of a semiconductor material having a bandgap energy lower than that of wire 26 and of semiconductor layer 44, preferably interposed between two barrier layers, thus improving the confinement of charge carriers, and the barrier layers may be made of the same material as wire 26 and non-intentionally doped. Active area 40 may be formed of a single quantum well or of a plurality of quantum wells. As an example, in FIG. 1, an alternation along axis C of two quantum wells 50 and of three barrier layers 52 has been shown.

An example of a method of manufacturing optoelectronic device 10 comprises growing wires 26, active areas 40, and semiconductor stacks 42 by implementing a growth method which favors a crystal growth along axis C of wires 26. The wire growth method may be a method of chemical vapor deposition (CVD) or metal-organic vapor phase epitaxy (MOCVD) type, also known as metal-organic vapor phase epitaxy (MOVPE), or a method such as molecular beam epitaxy (MBE), gas-source MBE (GSMBE), metal-organic MBE (MOMBE), plasma-assisted MBE (PA-MBE), atomic layer deposition (ALD) or hydride vapor phase epitaxy or halide vapor phase epitaxy (HVPE), may be used. However, electrochemical processes may be used, for example, chemical bath deposition (CBD), hydrothermal processes, liquid aerosol pyrolysis, or electrodeposition.

The structure shown in FIG. 1 illustrates the targeted ideal structure. However, in practice, it may be impossible to totally prevent the forming of the layers of semiconductor stack 42 on the lateral walls of active area 40 and of the associated wire 26.

Figure 2:
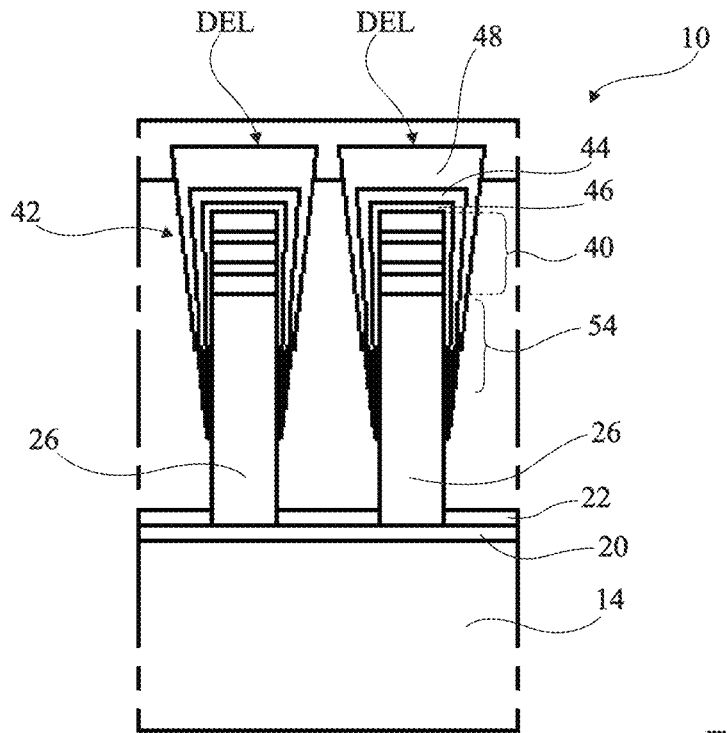
FIG. 2 is a cross-section view similar to FIG. 1 of the optoelectronic device obtained according to real manufacturing conditions.
Figure 3:
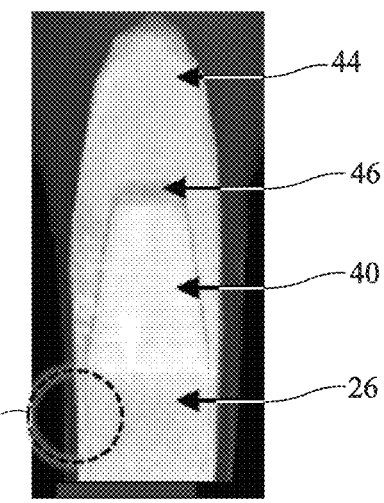
FIG. 3 is an image obtained by scanning transmission electron microscopy of a portion of the device of FIG. 2.

FIG. 2 is a partial simplified cross-section view similar to FIG. 1 illustrating the structure of the optoelectronic device 10 really obtained and FIG. 3 is an image, obtained by scanning transmission electron microscopy, of the upper end of a wire 26, of active area 40, and of semiconductor stack 42 formed by MBE.

For each light-emitting diode DEL, the forming of passages 54 for the current between semiconductor layer 44 and wire 26 shorting active area 40 can be observed. This causes a decrease in the emission performance of light-emitting diode DEL.

The inventors have shown that by adjusting the growth conditions to obtain, for each wire 26, a flared shape at the top of wire 26 and by implementing the specific growth method at least for the forming of semiconductor stack 42, it is possible to prevent the forming of the layers of semiconductor stack 42 directly in contact with wire 26 at least at the level of the top of wire 26. The specific growth methods are methods of growth under vacuum at a pressure lower than 1.33 mPa ($10^{-5}$ Torr), preferably lower than 0.0133 mPa ($10^{-7}$ Torr), for which molecular beams are projected onto the surfaces on which a crystalline structure is desired. The growth method is for example MBE or PA-MBE. Due to the low pressures, the molecular beams have a quasi-ballistic behavior. Thereby, the flared shape of the top of wire 26 forms a shield blocking the molecular beams and preventing the forming of the semiconductor layers of semiconductor stack 42 on the lateral walls of wire 26 at least at the level of the top of wire 26.

Figure 4:
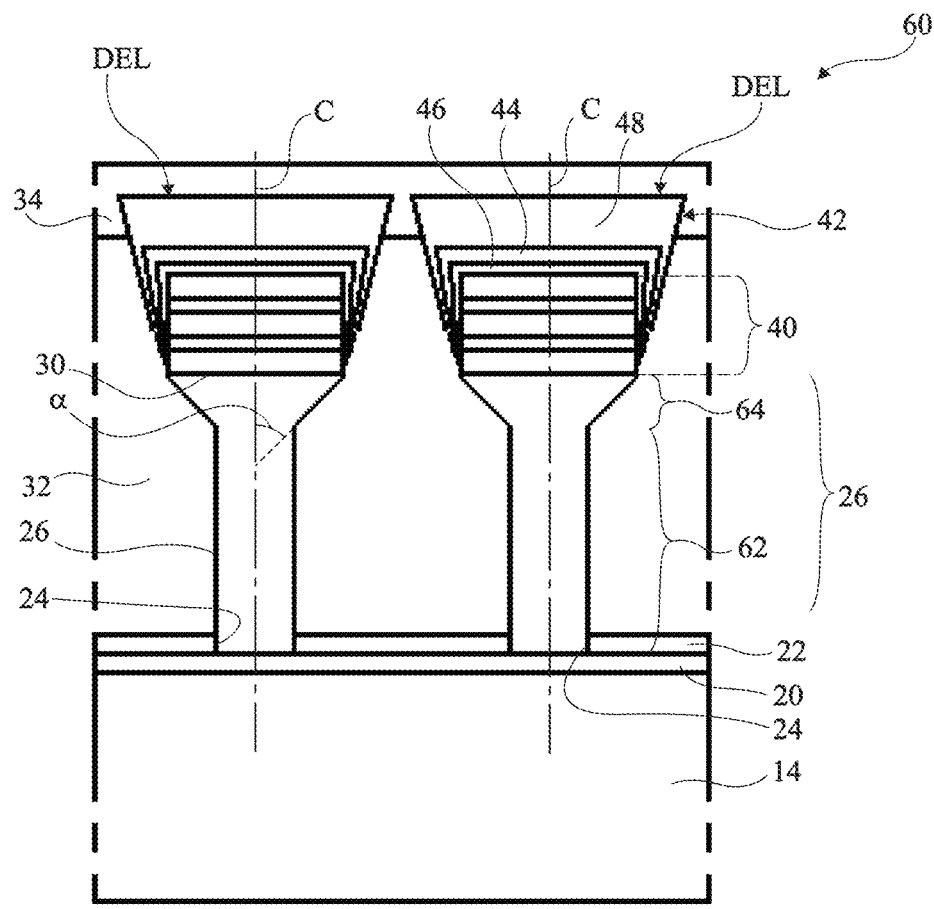
FIG. 4 shows an embodiment of an optoelectronic device comprising axial-type light-emitting diodes.

FIG. 4 is a cross-section view of an embodiment of an optoelectronic device 60. Optoelectronic device 60 comprises all the elements of the optoelectronic device 10 shown in FIG. 1, with the difference that each wire 26 comprises a lower portion 62 having a substantially constant cross-section extending in an upper portion 64 of outward-flared shape, where the cross-section area increases along axis C as the distance to substrate 14 increases. As appears in this drawing, the layers of semiconductor stack 42 do not extend in contact with wire 26 at least at the level of the top of wire 26. In the embodiment shown in FIG. 4, upper portion 64 comprises substantially planar facets inclined with respect to axis C by an angle $\alpha$. Generally, call angle of upper portion 64 the half apical angle of the frustum of axis C of circular base having upper portion 64 inscribed therein. According to an embodiment, angle $\alpha$ is greater than 0°, preferably between 5° and 50°, more preferably between 5° and 30°.

Preferably, for each wire 26, the top 30 of the upper portion 62 of wire 26 corresponds to a substantially planar surface orthogonal to axis C of wire 26. Preferably, the surface area of top 30 is greater by at least 20% than the cross-section area of the lower portion 62 of wire 26. The height of the upper portion 64 of each wire 26 measured along axis C may be in the range from 5 nm to 2 μm, preferably from 20 nm to 500 nm. The height of the lower portion 62 of each wire 26 measured along axis C may be in the range from 200 nm to 5 μm. For each wire 26, the mean diameter of the lower portion 62 of wire 26, which is the diameter of the disk of same surface area as the cross-section area of wire 26, may be in the range from 50 nm to 10 μm, preferably from 100 nm to 2 μm, preferably from 100 nm to 1 μm. The cross-section of the lower portion 62 of wire 26 may have different shapes, for example, oval, circular, or polygonal, in particular rectangular, square, or hexagonal.

Wires 26, semiconductor layers 44, and bonding layers 48 may be at least partly made of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions. The III-V compounds of the wires and of layers 44, 48 may comprise a dopant, for example, silicon, which is an n-type dopant for III-N compounds, or magnesium, which is a p-type dopant for III-N compounds.

The semiconductor material of the quantum well or of the quantum wells of active area 40 may comprise the III-V compound of wire 26 and of semiconductor layer 44 having at least one additional element incorporated into it. As an example, in the case of wires 26 made of GaN, the additional element is for example indium (In). The atomic percentage of the additional element is a function of the desired optical properties and of the emission spectrum of light-emitting diode DEL. When the upper portion 64 of wire 26 is not intentionally doped, the latter may replace one of the barrier layers of active area 40.

Electron blocking layer 46 may be formed of a ternary alloy, for example, of aluminum gallium nitride (AlGaN) or of aluminum indium nitride (AlInN).

Substrate 14 may correspond to a monoblock structure or may correspond to a layer covering a support made of another material. Substrate 14 is preferably a semiconductor substrate, for example, a substrate made of silicon, of germanium, of silicon carbide, of a III-V compound, such as GaN or GaAs, or a conductive substrate, for example, a metal substrate, particularly made of copper, of titanium, of molybdenum, of an alloy based on nickel or steel, or a sapphire substrate. Preferably, substrate 14 is a single-crystal silicon substrate. Preferably, it is a semiconductor substrate compatible with manufacturing methods implemented in microelectronics. Substrate 14 may correspond to a multilayer structure of silicon-on-insulator type, also called SOI.

Seed layer 20 is made of a material favoring the growth of wires 26. As an example, the material forming seed layer 20 may be a nitride, a carbide, or a boride of a transition metal from column IV, V, or VI of the periodic table of elements, or a combination of these compounds. As an example, seed layer 20 may be made of aluminum nitride (AlN). Seed layer 20 may have a monolayer structure or may correspond to a stack of two layers or of more than two layers.

Insulating layer 22 may be made of a dielectric material, for example, silicon oxide ($SiO_2$) or silicon nitride ($Si_xN_y$, where x is approximately equal to 3 and y is approximately equal to 4, for example, $Si_3N_4$). As an example, the thickness of insulating layer 22 is in the range from 5 nm to 100 nm, for example, equal to approximately 30 nm. Insulating layer 22 may have a monolayer structure or may correspond to a stack of two layers or of more than two layers.

Insulating layer 32 may be made of a dielectric material, for example, silicon oxide ($SiO_2$) or silicon nitride ($Si_xN_y$, where x is approximately equal to 3 and y is approximately equal to 4, for example, $Si_3N_4$). Insulating layer 32 may have a monolayer structure or may correspond to a stack of two layers or of more than two layers. As an example, insulating layer 32 may be made of a polymer material, of an inorganic material, or of a polymer material and of an inorganic material. As an example, the inorganic material may be titanium oxide ($TiO_2$) or aluminum oxide ($Al_xO_y$, where x is approximately equal to 2 and y is approximately equal to 3, for example, $Al_2O_3$).

Electrode layer 34 is capable of biasing the active area 40 covering each wire 26 and of giving way to the electromagnetic radiation emitted by light-emitting diodes DEL. The material forming electrode layer 34 may be a transparent and conductive material such as indium tin oxide (ITO), zinc oxide, doped or not with aluminum or gallium, or graphene. As an example, electrode layer 34 has a thickness in the range from 5 nm to 200 nm, preferably from 20 nm to 50 nm.

FIGS. 5 to 8 are partial simplified cross-section views of the structure obtained at successive steps of another embodiment of a method of manufacturing the optoelectronic device 60 shown in FIG. 4.

Figure 5:
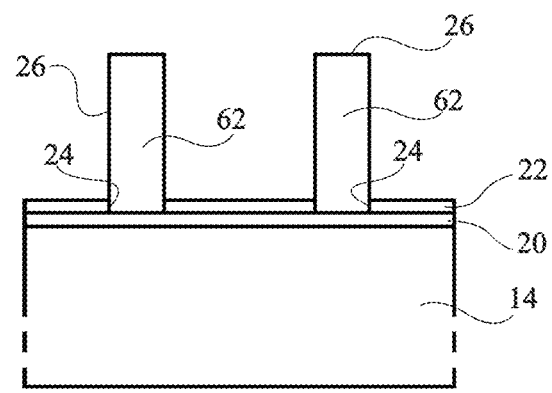
FIG. 5 illustrates a step of an embodiment of a method of manufacturing the optoelectronic device shown in FIG. 4.

FIG. 5 shows the structure obtained after the steps of:
forming on substrate 14 of seed layer 20;
forming of insulating layer 22 on seed layer 20;
forming of openings 24 in insulating layer 22 to expose portions of seed layer 20 at the desired locations of wires 26, the diameter of openings 24 substantially corresponding to the mean diameter of the lower portions 62 of wires 26; and
growth of the lower portions 62 of wires 26 from seed layer 20 in openings 24.

Seed layer 20 and insulating layer 22 may be formed by CVD, physical vapor deposition (PVD), or ALD.

According to an embodiment, the growth of the lower portions 62 of wires 26 is achieved by PA-MBE. The pressure in the reactor is in the range from $10^{-4}$ Torr (13.3 mPa) to $10^{-7}$ Torr (0.0133 mPa). The growth conditions in the reactor are adapted to promoting the preferential growth of the lower portion 62 of each wire 26 along its axis C. This means that the growth speed of wire 26 along axis C is much greater, preferably by at least one order of magnitude, than the growth speed of wire 26 along a direction perpendicular to axis C. Call III/V ratio the ratio of the atomic flux of the group-III element to the atomic flux of the group-V element. The III/V ratio is preferably smaller than 1.4, particularly in the range from 0.3 to 1.4, more preferably in the range from 0.35 to 1, for example, equal to approximately 0.8. The temperature in the reactor is for example in the range from 600° C. to 1,000° C., preferably from 700° C. to 950° C., more preferably from 800° C. to 925° C., for example, approximately 900° C.

Figure 6:
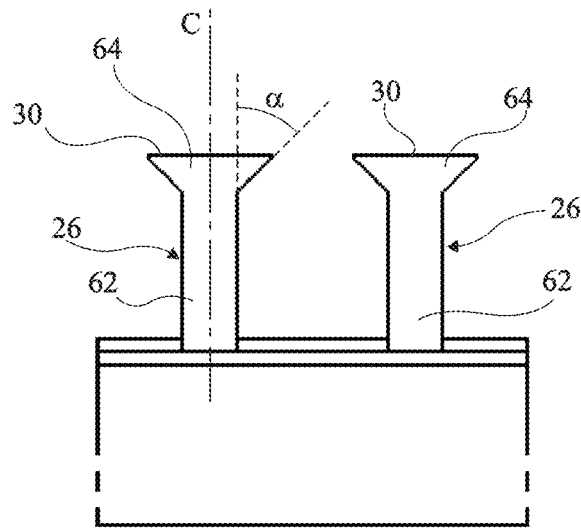
FIG. 6 illustrates another step of the method.

FIG. 6 shows the structure obtained after the growth of the upper portions 64 of wires 26. According to an embodiment, the growth of the upper portions 64 of wires 26 is achieved by PA-MBE. The pressure in the reactor is in the range from $10^{-4}$ to $10^{-7}$ Torr. The III/V ratio is preferably greater than 1.1, particularly in the range from 1.1 to 2, more preferably in the range from 1.3 to 1.6, for example, equal to approximately 1.4. The temperature in the reactor is lower than the temperature used for the forming of the lower portions 62 of the wires when they are formed by MBE, preferably of at least 50° C., for example, in the range from 550° C. to 950° C., preferably from 650° C. to 900° C., more preferably from 750° C. to 875° C., for example, approximately 850° C. This enables to obtain a widening of the upper portion 64 of each wire 26, preferably by at least 20%. An upper portion 64 having its lateral portion forming angle α with axis C as previously described is then obtained.

Advantageously, when the upper portions 64 of wires 26 are formed by PA-MBE, the dimensions of the surface area of the top 30 of each upper portion 64, having active area 40 formed therein, are substantially set by the III/V ratio used for the forming of upper portion 64, and are substantially independent from the mean diameter of the lower portion 62 of wire 26 having upper portion 64 extending therefrom. This thus enables to accurately control the dimensions of the surface of top 30 of upper portion 64 and thus the lateral dimensions of active area 40. This enables to at least partially compensate for the variations of the mean diameters of the lower portions 62 of wires 26 which may result from the wire manufacturing method.

Further, the wavelength of the radiation emitted by a quantum well particularly depends on the proportion of the additional group-III element, for example, indium, incorporated in the ternary compound of the quantum well. This proportion itself depends on the lateral dimensions of active area 40. Thereby, an accurate control of the lateral dimensions of active area 40 enables to accurately control the wavelength of the radiations emitted by active area 40. The variations of the wavelengths of the radiation emitted by the light-emitting diodes can thus be decreased.

Figure 7:
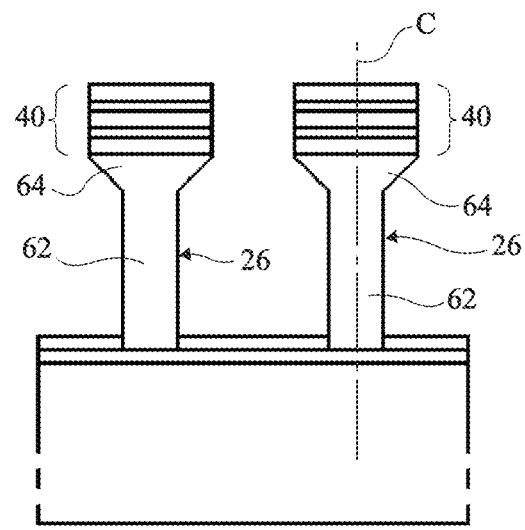
FIG. 7 illustrates another step of the method.

FIG. 7 shows the structure obtained after the growth of the layers of active areas 40. According to an embodiment, the growth of the layers of active areas 40 is achieved by PA-MBE. The pressure in the reactor is in the range from $10^{-4}$ to $10^{-7}$ Torr. For the forming of the quantum well or of each quantum well, an additional group-III element is added in the reactor. The ratio of the atomic fluxes of the group-III elements to the atomic flux of the group-V element is equal to the III/V flux used for the forming of the upper portions 64 of wires 26 when they are formed by MBE. The temperature in the reactor is for example in the range from 500° C. to 750° C., preferably from 600° C. to 700° C.

Figure 8:
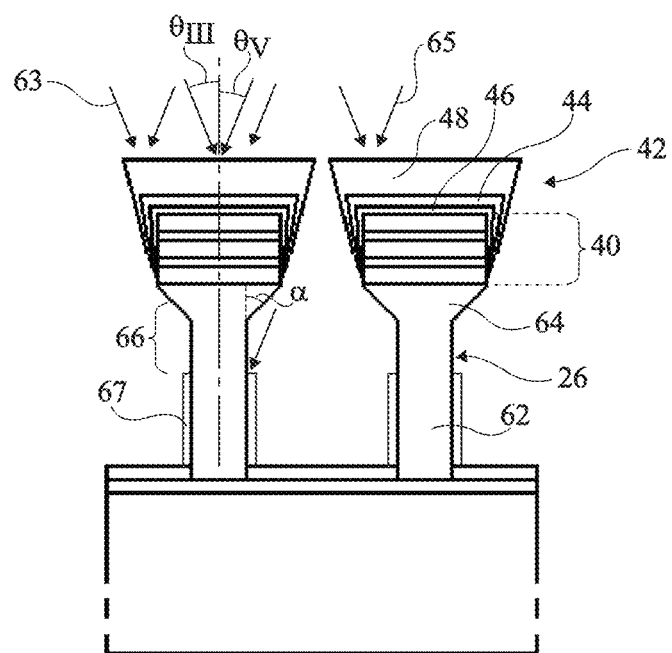
FIG. 8 illustrates another step of the method.

FIG. 8 shows the structure obtained after the growth of the layers of semiconductor stacks 42. According to an embodiment, the growth of the layers of semiconductor stacks 42 is achieved by PA-MBE. The structure is rotating in the reactor around a vertical axis. The pressure in the reactor is in the range from $10^{-4}$ to $10^{-7}$ Torr. For the forming of electron-blocking layer 46, an additional group-III element is added in the reactor, the III/V ratio is preferably close to 1, and the ratio of the atomic flux of the additional element to the atomic flux of the group-V element is in the range from 0.1 to 0.3. For the forming of electron-blocking layer 46, the temperature in the reactor is for example in the range from 600° C. to 1,000° C., preferably from 700° C. to 950° C., more preferably from 750° C. to 900° C. For the forming of semiconductor layer 44 or 48, the III/V ratio is preferably smaller than 1.3, particularly in the range from 1.1 to 1.3. For the forming of semiconductor layer 44 or 48, the temperature in the reactor is for example in the range from 700° C. to 900° C., preferably from 750° C. to 850° C. The atomic fluxes of the group-III element and of the group-V element are schematically shown in FIG. 8 by arrows 63, 65. Call $θ_{III}$ the angle of incidence of the atomic flux of the group-III element and $θ_V$ that of the atomic flux of the group-V element with respect to the axis C of the wires. Angles $θ_{III}$ and $θ_V$ particularly depend on the type of reactor used. When the largest of angles $θ_{III}$ and $θ_V$ is smaller than angle α, an area 66 is obtained on the lower portion 62 of each wire 26 where there has been no deposition while the forming of an undesired deposition 67 can be observed in the lower part of the lower portion 62 of each wire 26. For each wire 26, there is no continuity between the semiconductor layers of semiconductor stack 42 and the deposit 67 simultaneously formed on the lateral walls of wire 26, so that the forming of a short-circuit is prevented.

In FIGS. 7 and 8, each active area 40 has been shown with a substantially constant cross-section area along axis C. As a variant, the conditions of growth of active area 40 may be selected so that active area 40 has the shape of a truncated pyramid of axis C with a cross-section area which decreases along axis C as the distance to substrate 14 increases. Such a shape may be obtained with no significant loss of the volume of the quantum well or of the quantum wells with respect to the case where the cross-section area is constant. An active area 40 having the shape of a truncated pyramid advantageously enables to increase the thickness of the semiconductor layer 44 covering it and to improve the passivation of the surface of active area 40.

According to another embodiment, the growth of the lower portions 62 of wires 26, and/or of the upper portions 64 of wires 26, and/or of active areas 40 is achieved by another method than a vapor deposition at a pressure lower than 1.33 mPa ($10^{-5}$ Torr), particularly by PA-MBE. The growth method must however allow the forming of the flared upper portion 64 of each wire 26.

According to another embodiment, the growth of the lower portions 62 of wires 26, and/or of the upper portions 64 of wires 26, and/or of active areas 40 is achieved by MOCVD, by MBE, particularly ammonia-enhanced MBE, by atomic layer epitaxy (ALE). As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiary-butylphosphine (TBT), arsine ($AsH_3$), or unsymmetrical dimethylhydrazine (UDMH). Call III/V the ratio of the gas flux of the precursor of the group-III element to the gas flux of the precursor of the group-V element.

Figure 9:
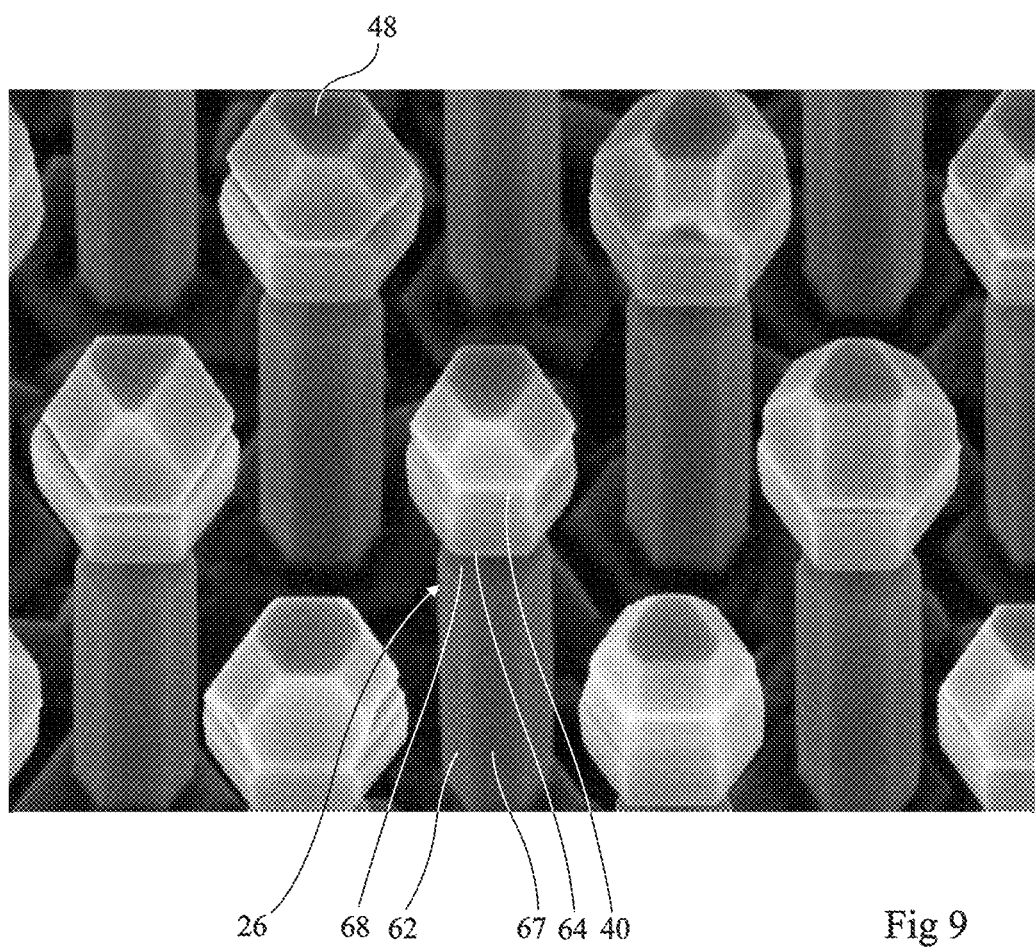
FIG. 9 is an image obtained by scanning electron microcopy of a portion of the device of FIG. 4.

FIG. 9 is an image, obtained by scanning electron microscopy, of the upper end of wires 26, of active areas 40, and of the semiconductor stacks 42 formed by MBE. The lower portions 62 of wires 26 were made of n-type doped GaN. The mean diameter of the lower portion 62 of each wire 26 was substantially equal to 500 nm. The upper portions 64 of wires 26 were made of n-type doped GaN. Each active area 40 comprised ten InGaN quantum wells with non-intentionally doped GaN barrier layers. Each semiconductor stack 42 would comprise an AlGaN blocking layer 46 and a p-type doped GaN semiconductor layer 44.

The lower portions 62 of wires 26 have been formed by MOCVD with a III/V ratio of 0.1 and a 1,050° C. temperature. The upper portions 64 of wires 26 have been formed by MBE with a Ga/N ratio of 1.6 and a 850° C. temperature. The InGaN quantum wells have been formed by MBE with a Ga+In/N ratio of 1.6 and a 750° C. temperature. The AlGaN blocking layers 46 have been formed by MBE with a (Ga+Al)/N ratio of 1. The p-type doped semiconductor GaN layers 44 have been formed by MBE with a Ga/N ratio of 1 and a 850° C. temperature.

As shown in FIG. 9, one can observe, for each wire, 26, a widening of the upper portion 64 of wire 26. Further, a deposit 67 of p-type GaN on the lateral walls of wire 26 can be observed, in the lower portion only of wire 26. The neck 68 of wire 26 corresponds to the portion of wire 26 where there is no p-type GaN deposit due to the shadowing made by the upper portion 64 of wire 26.

Various embodiments and variants have been described. Those skilled in the art will understand that certain features of these various embodiments and variants may be combined, and other variants will occur to those skilled in the art. Finally, the practical implementation of the described embodiments and variants is within the abilities of those skilled in the art based on the functional indications given hereabove.

The invention claimed is:

1. Method of manufacturing an optoelectronic device comprising light-emitting diodes comprising the forming of three-dimensional semiconductor elements, extending along parallel axes, made of a III-V compound, and each comprising a lower portion and an upper portion flared with respect to the lower portion and inscribed within a frustum having a half apical angle α, the method further comprising, for each semiconductor element, the forming of an active area covering the top of the upper portion and the forming of at least one semiconductor layer of the III-V compound covering the active area by vapor deposition at a pressure lower than 10 mPa, by using a flux of the group-III element along a first direction inclined by an angle $\theta_{III}$ and a flux of the group-V element along a second direction inclined by an angle $\theta_V$ with respect to the vertical axis, the largest of the two angles $\theta_{III}$ and $\theta_V$ being smaller than angle α.

2. Method according to claim 1, wherein the semiconductor layers are formed by molecular beam epitaxy.

3. Method according to claim 2, wherein the III/V ratio, for the forming of the semiconductor layers, is smaller than 1.4, preferably smaller than 1.3.

4. Method according to claim 1, wherein angle α is greater than 0°, preferably in the range from 5° to 50°, more preferably in the range from 5° to 30°.

5. Method according to claim 1, wherein the upper portions of the three-dimensional semiconductor elements are formed by molecular beam epitaxy.

6. Method according to claim 5, wherein the III/V ratio, for the forming of the upper portions of the three-dimensional semiconductor elements, is greater than 1.1.

7. Method according to claim 1, wherein the lower portions of the three-dimensional semiconductor elements are formed by molecular beam epitaxy.

8. Method according to claim 7, wherein the III/V ratio, for the forming of the lower portions of the three-dimensional semiconductor elements, is smaller than 1.4.

9. Method according to claim 7, wherein the temperature during the forming of the upper portions of the three-dimensional semiconductor elements is smaller by at least 50° C. than the temperature during the forming of the lower portions of the three-dimensional semiconductor elements.

10. Method according to claim 1, wherein the active areas are formed by molecular beam epitaxy.

11. Method according to claim 1 to 10, wherein the lower portions of the three-dimensional semiconductor elements are microwires, nanowires, micrometer- or nanometer-range conical elements, or micrometer- or nanometer-range frustoconical elements.

12. Method according to claim 1, wherein the active areas are the regions having most of the electromagnetic radiation supplied by the light-emitting diodes emitted therefrom.

* * * * *